United States Patent
Goto et al.

(10) Patent No.: US 9,670,581 B2
(45) Date of Patent: Jun. 6, 2017

(54) PRODUCTION METHOD OF EPITAXIAL SILICON WAFER AND VAPOR DEPOSITION APPARATUS

(71) Applicant: SUMCO CORPORATION, Tokyo (JP)

(72) Inventors: Motoki Goto, Tokyo (JP); Yusuke Kurozumi, Tokyo (JP); Kan Yoshitake, Tokyo (JP); Hitoshi Takamiya, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/855,943

(22) Filed: Sep. 16, 2015

(65) Prior Publication Data
US 2016/0083836 A1     Mar. 24, 2016

Related U.S. Application Data

(60) Provisional application No. 62/052,114, filed on Sep. 18, 2014.

(30) Foreign Application Priority Data

Sep. 19, 2014   (JP) .................................. 2014-191580

(51) Int. Cl.
*H01L 21/20*     (2006.01)
*C23C 16/44*     (2006.01)
(Continued)

(52) U.S. Cl.
CPC ...... *C23C 16/4405* (2013.01); *C23C 16/4409* (2013.01); *C30B 25/08* (2013.01); *C30B 29/06* (2013.01); *H01L 29/36* (2013.01)

(58) Field of Classification Search
CPC ......... H01L 21/02293; H01L 21/02269; H01L 21/0228; H01L 21/2036; H01L 21/2056; H01L 21/2085
(Continued)

(56) References Cited

U.S. PATENT DOCUMENTS

2002/0020433 A1   2/2002   Suemura et al.
2011/0151592 A1   6/2011   Libbert et al.
(Continued)

FOREIGN PATENT DOCUMENTS

JP    05-144751    6/1993
JP    09-063956    3/1997
(Continued)

OTHER PUBLICATIONS

Office Action issued in U.S. Appl. No. 14/856,005, dated Feb. 25, 2016.
(Continued)

*Primary Examiner* — Brook Kebede
(74) *Attorney, Agent, or Firm* — Greenblum & Bernstein, P.L.C.

(57) ABSTRACT

A method for producing an epitaxial silicon wafer by applying a vapor deposition on a silicon wafer is disclosed. A vapor deposition apparatus in which the vapor deposition is conducted at least includes a chamber and a hydrogen-chloride-gas supply apparatus that is in communication and connected with an inside of the chamber to supply hydrogen chloride gas into the chamber. A valve including a diaphragm that allows or blocks a flow of the hydrogen chloride gas from an inlet channel to an outlet channel is disposed in the hydrogen-chloride-gas supply apparatus. A W-free anti-corrosion alloy material is used for the diaphragm. When a maintenance work is to be done inside the chamber, the hydrogen chloride gas is supplied from the hydrogen-chloride-gas supply apparatus into the chamber.

3 Claims, 15 Drawing Sheets

(51) Int. Cl.
*H01L 29/36* (2006.01)
*C30B 25/08* (2006.01)
*C30B 29/06* (2006.01)

(58) Field of Classification Search
USPC .................................................. 438/478, 767
See application file for complete search history.

(56) References Cited

U.S. PATENT DOCUMENTS

| | | | |
|---|---|---|---|
| 2012/0115258 A1 | 5/2012 | Libbert et al. | |
| 2012/0272892 A1* | 11/2012 | Paranjpe | C30B 25/10 117/86 |
| 2015/0243566 A1 | 8/2015 | Arai et al. | |
| 2016/0079130 A1 | 3/2016 | Ohtsuki | |

FOREIGN PATENT DOCUMENTS

| | | |
|---|---|---|
| JP | 2001-250818 A | 9/2001 |
| JP | 2007-258602 A | 10/2007 |
| JP | 2010-135388 A | 6/2010 |
| JP | 2012-174706 A | 9/2012 |
| JP | 2013-516063 A | 5/2013 |
| JP | 2014-99478 A | 5/2014 |
| WO | 2014/061413 A | 4/2014 |
| WO | 2014/156043 A | 10/2014 |
| WO | 2014/192215 A1 | 12/2014 |

OTHER PUBLICATIONS

U.S. Appl. No. 14/856,005 to Motoki Goto et al., filed Sep. 16, 2015.
Decision to Grant a Patent in Japan family member Patent Appl. No. 2014-191580, dated Jun. 23, 2015, along with an English-language translation thereof.
Notice of Reasons for Rejection issued in Japan family member Patent Appl. No. 2014-191580, dated Apr. 28, 2015, along with an English-language translation thereof.
U.S. Appl. No. 14/857,198 to Nogami, filed Sep. 17, 2015.
Office Action issued in Japan family member Patent Appl. No. 2015-115815, dated Aug. 23, 2016 , along with an English translation thereof.
Office Action issued in Japan Counterpart Patent Appl. No. 2015-115815, dated Feb. 21, 2017, along with an English translation thereof.

* cited by examiner

PRODUCTION METHOD OF EPITAXIAL SILICON WAFER AND VAPOR DEPOSITION APPARATUS

The entire disclosure of U.S. Provisional Application No. 62/052,114 filed Sep. 18, 2014 and Japanese Patent Application No. 2014-191580 filed Sep. 19, 2014 is expressly incorporated by reference herein.

FIELD OF THE INVENTION

The present invention relates to a production method of an epitaxial silicon wafer and a vapor deposition apparatus.

BACKGROUND ART

Recently, substrates of image pickup devices such as CCD and CIS are often made of an epitaxial silicon wafer including an epitaxial layer provided by a vapor deposition on a silicon wafer. It is crucially important for such an epitaxial silicon wafer for an image pickup device that an amount of heavy-metal impurities in the silicon wafer is lowered. This is because, when heavy-metal impurities are present in a wafer, so-called white defects (defects in device characteristics, which are unique to an image pickup device) are caused.

During the production of epitaxial silicon wafers using vapor deposition, $H_2$ and Si material gases are used for the vapor deposition of the epitaxial layer. By-products are also generated during the vapor deposition, which are deposited in a chamber. The deposited by-products are a source of contamination. Accordingly, in order to remove the by-products, the chamber is regularly cleaned. Hydrogen chloride gas is used as a cleaning gas.

Even when a highly anti-corrosive metal is used for a component of a vapor deposition apparatus, since hydrogen chloride gas is highly corrosive, the component of the vapor deposition apparatus still corrodes in an atmosphere of highly-concentrated hydrogen chloride gas. Then, metal contaminant (e.g. metal chloride) caused by the corrosion is introduced into the wafer and, consequently, the produced epitaxial silicon wafer is contaminated with the metal.

In order to reduce the metal contamination caused by the vapor deposition apparatus, it has been proposed to cover a part of vapor deposition apparatus components, which is made of a material containing metal and is to be in contact with the gas, with a non-metal protection film and to use an O-ring not containing Ti at a connecting portion of each of the components (see Patent Literature 1: JP-A-2010-135388). According to Patent Literature 1, since a contact of gas and metal can be prevented with the use of the above-described vapor deposition apparatus, the metal contamination can be avoided. Consequently, it is reported that a high-quality epitaxial silicon wafer with small number of white defects, total concentration of four elements of Mo, W, V and Nb is $4 \times 10^{10}/cm^3$ or less, and Ti concentration of $3 \times 10^{12}/cm^3$ or less can be produced.

However, according to the method disclosed in the above Patent Literature 1, since it is necessary to regularly renew the coating of the component(s) coated with the non-metal protection film, complicated work has to be done each time the regular re-coating is done. Further, it is expected to be difficult in terms of the design to completely cover an entirety of the metal component(s) that is to be in contact with gas using a protection film.

SUMMARY OF THE INVENTION

An object of the invention is to provide a production method of an epitaxial silicon wafer and a vapor deposition apparatus that are capable of easily restraining the generation of white defects.

A method according to an aspect of the invention is for producing an epitaxial silicon wafer, the method including: applying a vapor deposition on a silicon wafer to obtain the epitaxial silicon wafer, in which a vapor deposition apparatus, in which the vapor deposition is conducted, at least comprises a chamber, and a hydrogen-chloride-gas supply apparatus that is in communication and connected with an inside of the chamber to supply hydrogen chloride gas into the chamber, a valve that comprises a diaphragm configured to regulate a flow of the hydrogen chloride gas from an inlet channel to an outlet channel is disposed in the hydrogen-chloride-gas supply apparatus, a W-free anticorrosion alloy material is used for the diaphragm, and when a maintenance work is to be done to the inside of the chamber, the hydrogen chloride gas is supplied from the hydrogen-chloride-gas supply apparatus into the chamber.

According to the above aspect of the invention, a W-free anticorrosion alloy material is used for the diaphragm of the valve in the hydrogen-chloride-gas supply apparatus. Accordingly, even when the diaphragm is corroded by the highly corrosive hydrogen chloride gas supplied by the hydrogen-chloride-gas supply apparatus during the chamber cleaning, W that is supposed to greatly contribute to the generation of white defects is not eluted. Since the W contamination from the hydrogen-chloride-gas supply apparatus to the chamber during the chamber cleaning can be reduced as described above, consequently, with the use of the above vapor deposition apparatus, a high quality epitaxial silicon wafer that is capable of restraining the generation of white defects can be easily produced.

In the method for producing an epitaxial silicon wafer according to the above aspect of the invention, it is preferable that the W-free anticorrosion alloy material is a W-free Co—Ni—Cr—Mo alloy.

According to the above arrangement, since the W-free Co—Ni—Cr—Mo alloy is used as the W-free anticorrosion alloy material used for the diaphragm, W contamination derived from the diaphragm can be restrained.

In the method for producing an epitaxial silicon wafer according to the above aspect of the invention, it is preferable that the valve including the diaphragm is a pressure regulator valve configured to regulate a pressure of the hydrogen chloride gas flowing therein, and a W-free Ni—Cr—Mo alloy is used for a component defining a channel in the pressure regulator valve.

According to the above arrangement, since the W-free Ni—Cr—Mo alloy is used for the component defining the channel in the pressure regulator valve, W contamination derived from the pressure regulator valve can be restrained. Consequently, the introduction of the W contamination from the hydrogen-chloride-gas supply apparatus into the chamber can be further reduced, whereby an epitaxial silicon wafer with extremely small W concentration in the epitaxial layer can be provided.

A vapor deposition apparatus according to another aspect of the invention is configured to apply a vapor deposition on a silicon wafer to produce an epitaxial silicon wafer, the vapor deposition apparatus at least including: a chamber; and a hydrogen-chloride-gas supply apparatus that is in communication and connected with an inside of the chamber to supply hydrogen chloride gas into the chamber, in which a valve that comprises a diaphragm configured to regulate a flow of the hydrogen chloride gas from an inlet channel to an outlet channel is disposed in the hydrogen-chloride-gas supply apparatus, a W-free anticorrosion alloy material is used for the diaphragm, and, when a maintenance work is to be done to an inside of the chamber, the hydrogen chloride gas is supplied from the hydrogen-chloride-gas supply apparatus into the chamber.

According to the above aspect of the invention, a W-free anticorrosion alloy material is used for the diaphragm of the valve in the hydrogen-chloride-gas supply apparatus. Accordingly, even when the diaphragm is corroded by the highly corrosive hydrogen chloride gas supplied by the hydrogen-chloride-gas supply apparatus during the chamber cleaning, W that is supposed to greatly contribute to the generation of white defects is not eluted. Since the W contamination from the hydrogen-chloride-gas supply apparatus to the chamber during the chamber cleaning can be reduced as described above, consequently, with the use of the above vapor deposition apparatus, a high quality epitaxial silicon wafer that is capable of restraining the generation of white defects can be easily produced.

In the vapor deposition apparatus of the above aspect of the invention, it is preferable that the W-free anticorrosion alloy material is a W-free Co—Ni—Cr—Mo alloy.

According to the above arrangement, since the W-free Co—Ni—Cr—Mo alloy is used as the W-free anticorrosion alloy material used for the diaphragm, W contamination derived from the diaphragm can be restrained.

In the vapor deposition apparatus of the above aspect of the invention, it is preferable that the valve including the diaphragm is a pressure regulator valve configured to regulate a pressure of the hydrogen chloride gas flowing therein, and a W-free Ni—Cr—Mo alloy is used for a component defining a channel in the pressure regulator valve.

According to the above arrangement, since the W-free Ni—Cr—Mo alloy is used for the component defining the channel in the pressure regulator valve, W contamination derived from the pressure regulator valve can be restrained. Consequently, the introduction of the W contamination from the hydrogen-chloride-gas supply apparatus into the chamber can be further reduced, whereby an epitaxial silicon wafer with extremely small W concentration in the epitaxial layer can be provided.

BRIEF DESCRIPTION OF DRAWING(S)

DESCRIPTION OF EMBODIMENT(S)

An exemplary embodiment of the invention will be described below with reference to the attached drawings.

In order to solve the above problem(s), the inventors of the invention have conducted vigorous studies on the source of contamination that causes the white defects.

The hydrogen chloride gas used in order to clean the chamber is highly corrosive, though having a great effect for removing by-products. Accordingly, it is speculated that a metal contamination, which is caused when a hydrogen-chloride-gas supply apparatus for supplying hydrogen chloride gas is corroded by the hydrogen chloride gas, is introduced into a chamber to exert a great influence on the white defect characteristics of image pickup products.

Further, though it has been speculated that the primary source of contamination that causes the white defects is metal such as Mo, W, Ti, Nb, and Ta, the inventors have found that, among the metal contaminants, W contamination exerts the greatest influence on generation of the white defects.

Accordingly, the inventors have focused and studied on the hydrogen-chloride-gas supply apparatus for supplying hydrogen chloride gas into the chamber when the chamber is cleaned, and W as the contamination metal.

Figure 1:
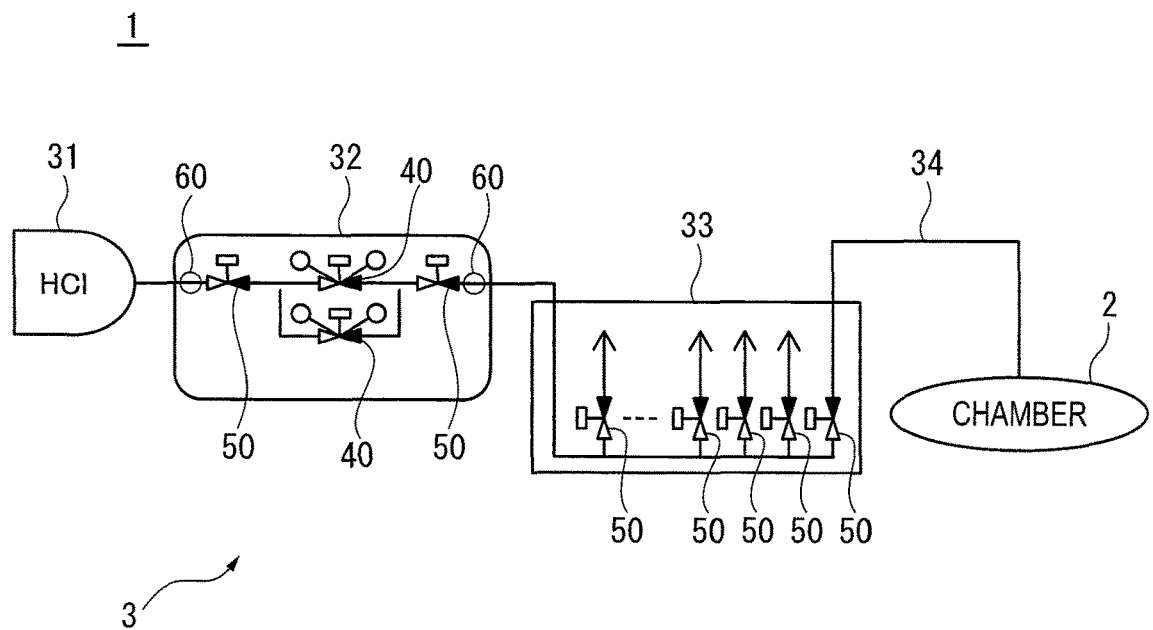
FIG. 1 is a schematic illustration showing a hydrogen-chloride-gas supply apparatus of a vapor deposition apparatus according to an exemplary embodiment.

As shown in FIG. 1, a vapor deposition apparatus 1 of the exemplary embodiment, in which vapor deposition is applied, at least includes a chamber 2, and a hydrogen-chloride-gas supply apparatus 3 that is in communication and connected with an inside of the chamber 2 to supply hydrogen chloride gas into the chamber 2. The hydrogen-chloride-gas supply apparatus 3 is provided in order to supply hydrogen chloride gas into the chamber 2 when the chamber 2 is cleaned.

The hydrogen-chloride-gas supply apparatus 3 includes a hydrogen-chloride-gas supply unit 31, a decompression unit 32 and a valve manifold box 33 (VMB). The hydrogen-chloride-gas supply apparatus 3 is in communication and connected with the chamber 2 through a pipe 34, in which the hydrogen chloride gas flows.

The decompression unit 32 is installed therein with a pressure regulator valve 40, a diaphragm valve 50, and a pressure gauge 60. The pressure regulator valve 40 controls the pressure of the hydrogen chloride gas flowing therethrough. The diaphragm valve 50 regulates the flow rate of the hydrogen chloride gas with a diaphragm. The pressure gauge 60 measures pressures of the hydrogen chloride gas before and after being decompressed by the pressure regulator valve 40.

It should be noted that, though the decompression unit 32 shown in FIG. 1 includes the two-stage pressure regulator valve 40, the decompression unit 32 may have a single-stage arrangement for the pressure regulator valve 40.

The pipe 34 is branched into a plurality of pipes in the VMB 33, and the diaphragm valve 50 is provided to each of the branched pipes 34. The pipes 34 branched in the VMB 33 are respectively connected to a plurality of the chambers 2, so that the hydrogen chloride gas can be supplied to the plurality of the chambers 2 with the single hydrogen-chloride-gas supply apparatus 3.

Figure 2:
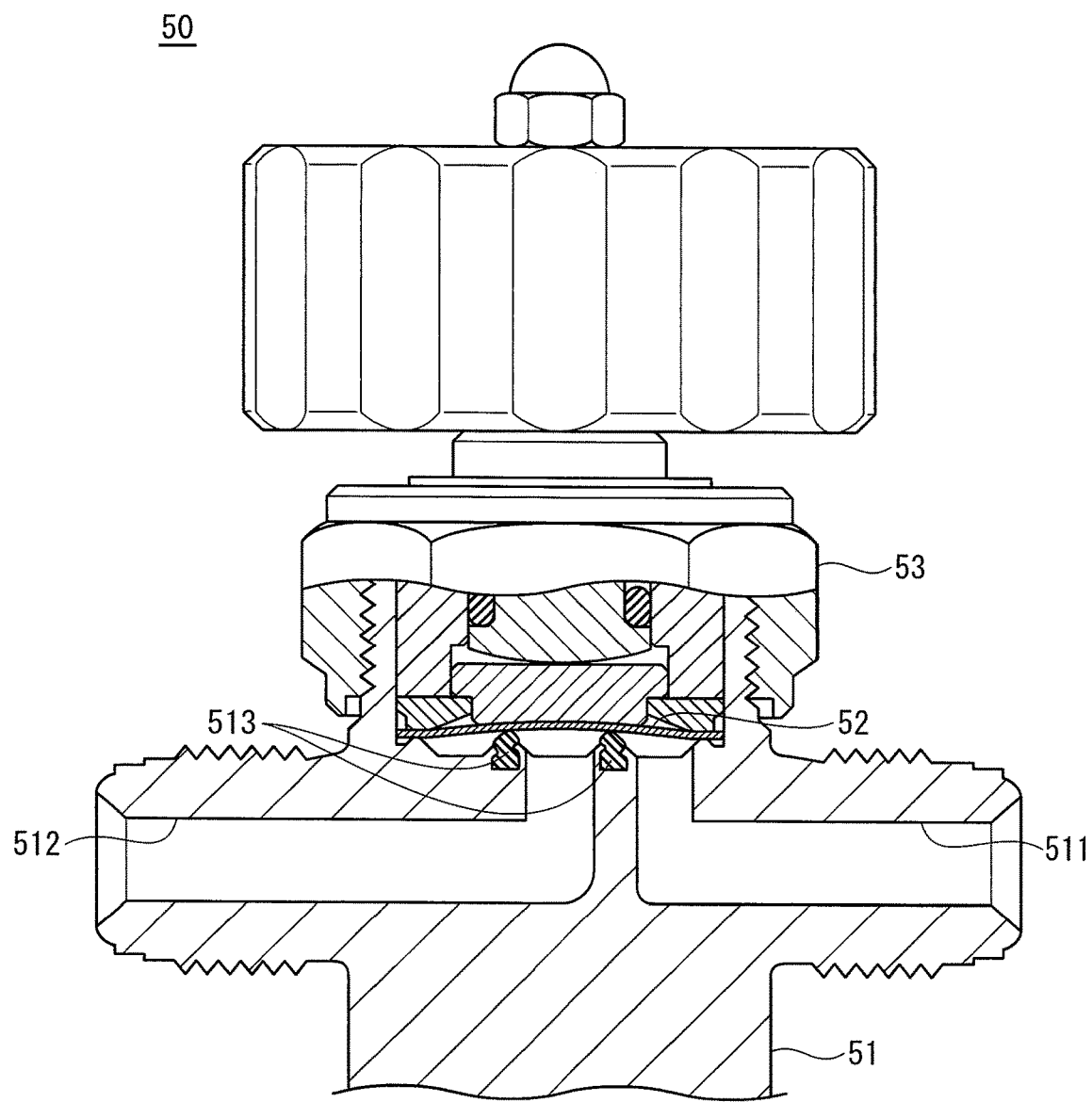
FIG. 2 shows an overall arrangement of a diaphragm valve.

FIG. 2 shows an overall arrangement of the diaphragm valve 50.

The diaphragm valve 50 includes a body portion 51, a diaphragm 52 and a drive portion 53. The body portion 51 is provided with an inlet channel 511 and an outlet channel 512, both of which define a channel for the hydrogen chloride gas, and a valve seat 513 to be in contact with the diaphragm 52. The diaphragm 52 is disposed to cover the inlet channel 511, the valve seat 513 and the outlet channel 512 of the body portion 51. The drive portion 53 is connected with the body portion 51 through the diaphragm 52 to lift and press the diaphragm 52.

The diaphragm valve 50 allows or blocks the communication between the inlet channel 511 and the outlet channel 512 of the body portion 51 by lifting the diaphragm 52 or pressing the diaphragm 52 onto the valve seat 513 of the body portion 51 using the drive portion 53.

Figure 3:
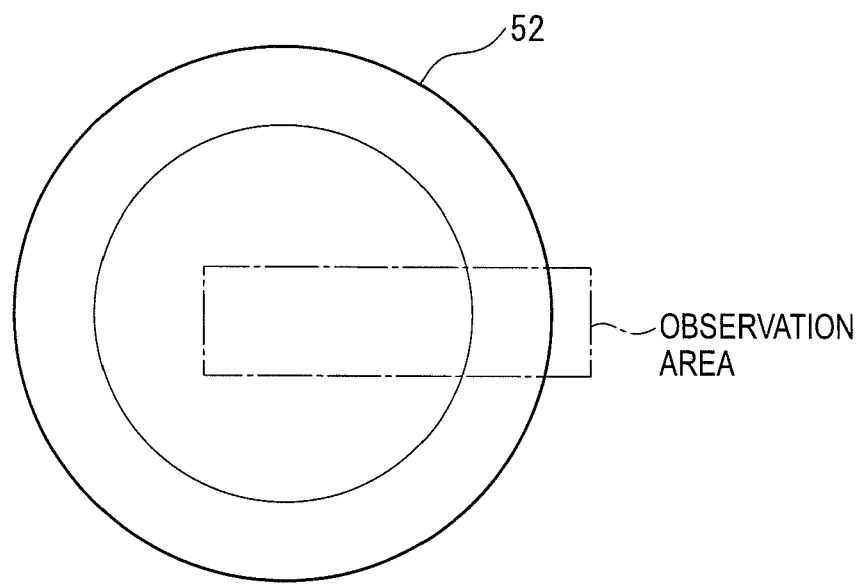
FIG. 3 is a schematic illustration showing a diaphragm of the diaphragm valve.

FIG. 3 is a plan view of the diaphragm 52. As shown in FIG. 3, the diaphragm 52 has a dented shape, thereby receiving a stress when the diaphragm valve 50 is opened or closed. Accordingly, the diaphragm 52 is likely to be corroded when the hydrogen chloride gas flows. It is speculated that the corroded portion is gasified to be introduced into the chamber 2.

Figure 4:
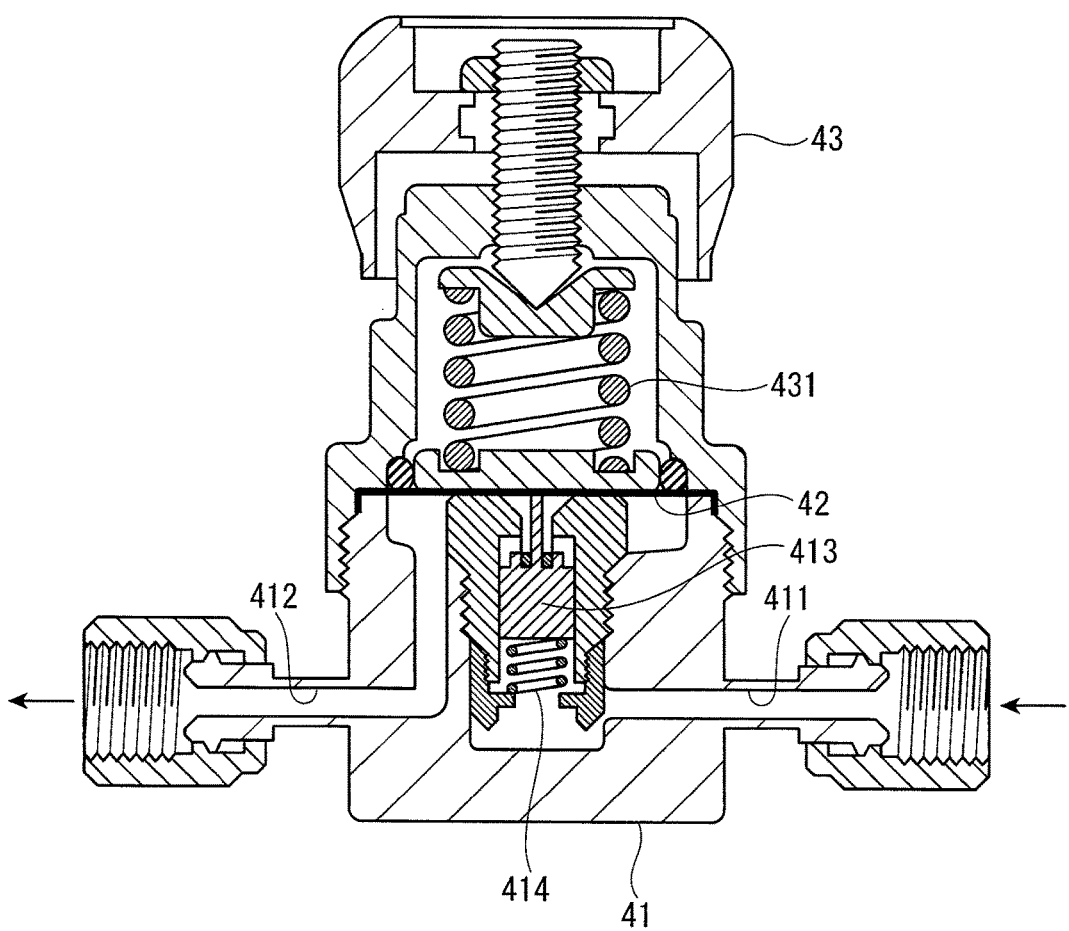
FIG. 4 shows an overall arrangement of a pressure regulator valve.

FIG. 4 is a cross section showing an overall arrangement of the pressure regulator valve 40.

The pressure regulator valve 40 includes a body portion 41, a diaphragm 42 and a pressure-adjustment handle 43. The body portion 41 is provided with an inlet channel 411 and an outlet channel 412, which define a channel for the hydrogen chloride gas, a seat 413 and a seal spring 414. The diaphragm 42 is disposed to be in contact with the seat 413 and to cover the inlet channel 411 and the outlet channel 412. The pressure-adjustment handle 43 is connected with the body portion 41 through the diaphragm 42 and includes a pressure-adjustment spring 431 that effects a pressure adjustment.

Corresponding to a fastening degree of the pressure-adjustment handle 43, a physical force is applied from the pressure-adjustment spring 431 to the diaphragm 42. A space volume of an area to be in contact with the flowing hydrogen chloride gas is thereby adjusted to effect the pressure adjustment (decompression). Since the pressure adjustment is repeatedly conducted, the component (e.g. the seat 413) defining the channel in the pressure regulator valve 40 and the diaphragm 42 are likely to be corroded when the hydrogen chloride gas flows. In the same manner as the diaphragm valve 50, it is speculated that the corroded portion is gasified to be introduced into the chamber 2.

Study on Pipe

The following evaluation test was conducted for the pipe 34 of the hydrogen-chloride-gas supply apparatus 3.

Initially, a pipe used for a plurality of times (referred to as a used pipe hereinafter) and an unused pipe (referred to as a new pipe hereinafter) were prepared. The pipe was made of SUS316L. The composition of SUS316L is shown in Table 1. It should be noted that two types of the used pipe (i.e. welded and non-welded) were examined. Then, the hydrogen chloride gas was supplied from the hydrogen-chloride-gas supply apparatus 3 installed with these pipes into the chamber 2.

Figure 5A:
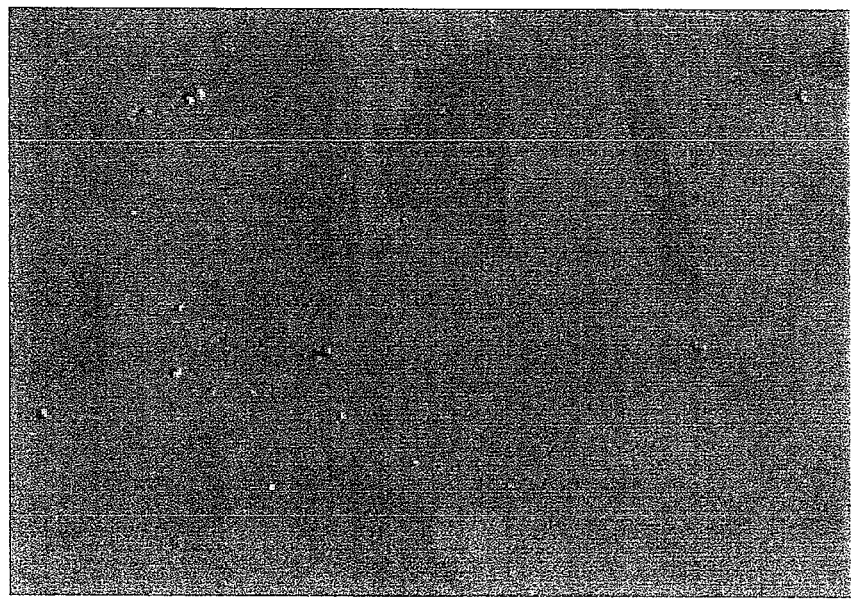
FIG. 5A shows an SEM image of an inner surface of a new pipe.
Figure 5B:
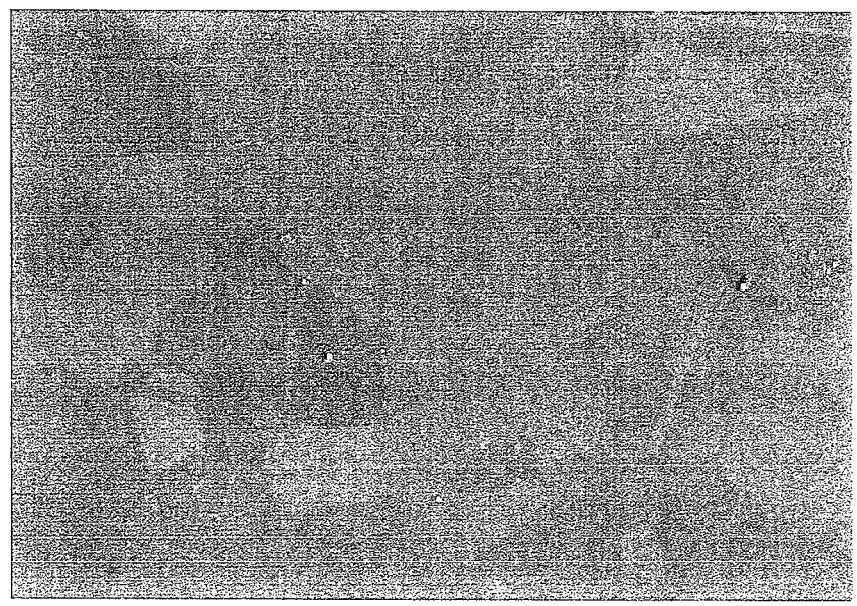
FIG. 5B shows an SEM image of an inner surface of a used pipe (non-welded).

Next, after the supplied hydrogen chloride gas was supplied, an image of the surface of the inside of the pipe was taken using a scanning electron microscope (SEM). The results are shown in FIGS. 5A and 5B. It should be noted that FIG. 5A shows an SEM image of the new pipe, and FIG. 5B shows an SEM image of the used pipe (non-welded).

As shown in FIGS. 5A and 5B, since SUS316L (pipe material) is low in corrosion resistance, both of the used pipe and the new pipe were slightly corroded. In the above, it was observed that the used pipe was more corroded.

Figure 6:
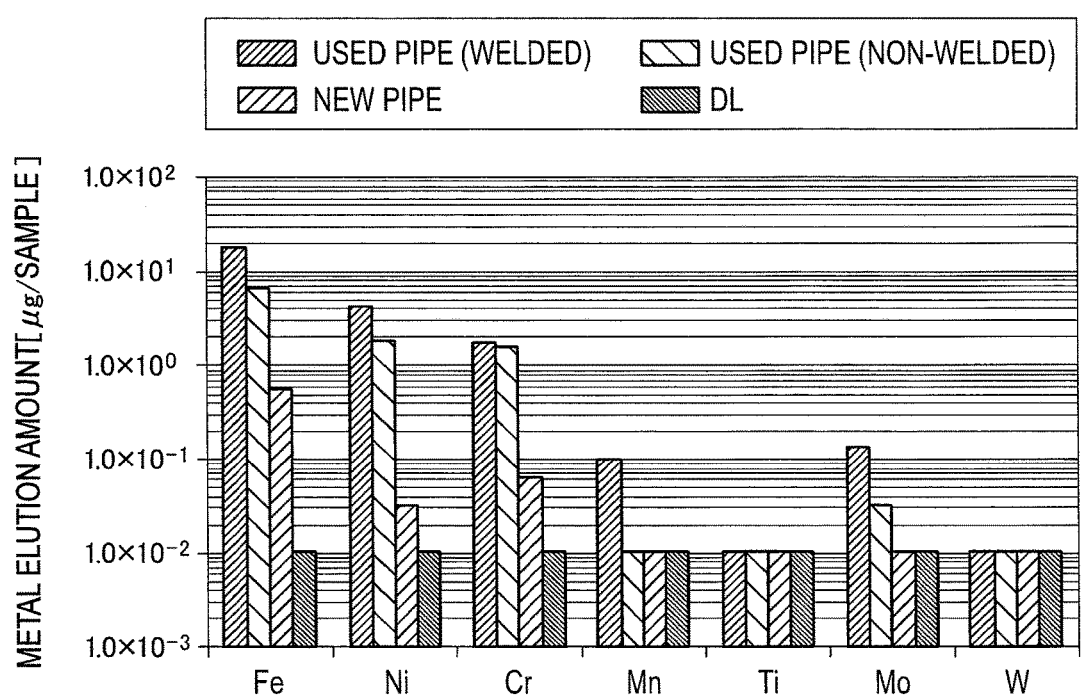
FIG. 6 is a graph showing a metal elution amount from each of the used pipe (welded and non-welded) and new pipe.

Further, for samples prepared after the hydrogen chloride gas was supplied (i.e. after the chamber was cleaned), metal analysis was performed according to inductively coupled plasma mass spectrometry (ICP-MS). According to the results of the metal analysis, it can be determined whether or not metals (Fe, Ni, Cr, Mn, Ti, Mo, W) is detected in the samples (i.e. whether or not the metals are eluted from the pipe). The results are shown in FIG. 6. Incidentally, DL in FIG. 6 denotes a detection limit.

As shown in FIG. 6, the metals such as Fe, Ni, Cr and Mo were detected in both of the used pipe and the new pipe. It should be noted that Mn was only detected in the welded used pipe and was not detected in non-welded used pipe or the new pipe. Further, since SUS316L contains no Ti and W, Ti and W were not detected in all of the pipes.

According to the above results, it can be concluded that SUS316L used as a material for the pipe 34 is not a source of W.

Study on Diaphragm Valve

Next, the following evaluation test was conducted for the diaphragm valve 50 of the hydrogen-chloride-gas supply apparatus 3. As a material for the diaphragm 52 of the diaphragm valve 50, SPRON 100 (one of Co—Ni—Cr—Mo alloys, which is excellent in corrosion resistance, manufactured by Seiko Instruments Inc.: SPRON is a registered trademark) was used. The composition of SPRON 100 is shown in Table 1. As shown in Table 1, SPRON 100 is an alloy containing W.

TABLE 1

| Alloy Material Name | Chemical Component [%] | | | | | | | | | | |
|---|---|---|---|---|---|---|---|---|---|---|---|
| | Ni | Co | Cr | Mo | W | Fe | Mn | Cu | Ti | Nb | Nb + Ta | Others |
| SUS316 (Fe—Cr—Ni—Mo Alloy) | 12.0-15.0 | — | 16.0-18.0 | 2.0-3.0 | — | Bal | ≤0.8 | ≤0.5 | — | — | — | Si, P, S, C |
| Hastelloy C22 (Ni—Cr—Mo alloy) | Bal | ≤2.5 | 20.0-22.5 | 12.5-14.5 | 2.5-3.5 | 2.0-6.0 | ≤0.5 | — | — | — | — | V, Si, P, S, C |

TABLE 1-continued

| Alloy Material Name | Chemical Component [%] | | | | | | | | | | | |
|---|---|---|---|---|---|---|---|---|---|---|---|---|
| | Ni | Co | Cr | Mo | W | Fe | Mn | Cu | Ti | Nb | Nb + Ta | Others |
| MAT21 (Ni—Cr—Mo alloy) | Bal | ≤1.0 | 18.0-20.0 | 18.0-20.0 | — | ≤1.0 | ≤0.5 | — | — | — | 1.5-2.2 | Si, P, S, C |
| SPRON 510 (Co—Ni—Cr—Mo alloy) | 31.4-33.4 | Bal | 19.5-20.5 | 9.5-10.5 | — | 1.1-2.1 | ≤0.5 | — | 0.3-0.7 | 0.8-1.2 | — | Si, P, S, C |
| SPRON 100 (Co—Ni—Cr—Mo alloy) | 16.0-17.0 | 38.0-39.4 | 11.6-12.2 | 3.8-4.2 | 3.8-4.2 | Bal | 0.5-1.1 | — | 0.4-0.8 | — | — | Si, Al, C, P, S |

*Bal: Residual composition

Figure 7:
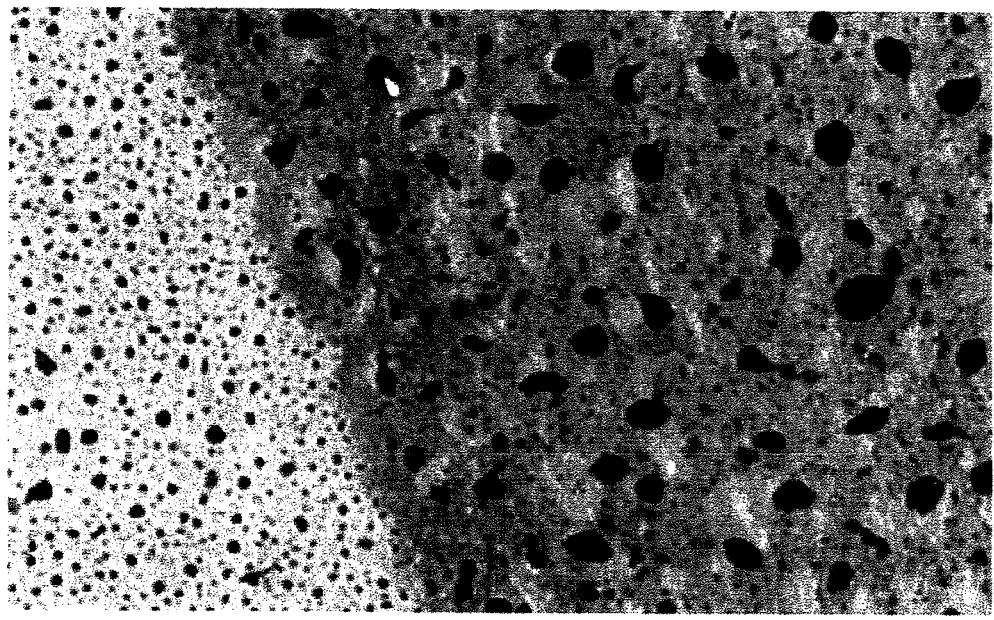
FIG. 7 is an SEM image of a diaphragm of the diaphragm valve in an observation area shown in FIG. 3.

Hydrogen chloride gas was supplied from the hydrogen-chloride-gas supply apparatus 3 into the chamber 2. Subsequently, after the hydrogen chloride gas was supplied, an image of a surface (a side in contact with the hydrogen chloride gas) of the diaphragm 52 of the diaphragm valve 50 was taken by an SEM. The results are shown in FIG. 7. It should be noted that FIG. 7 is an SEM image of an observation area indicated in FIG. 3.

Figure 8:
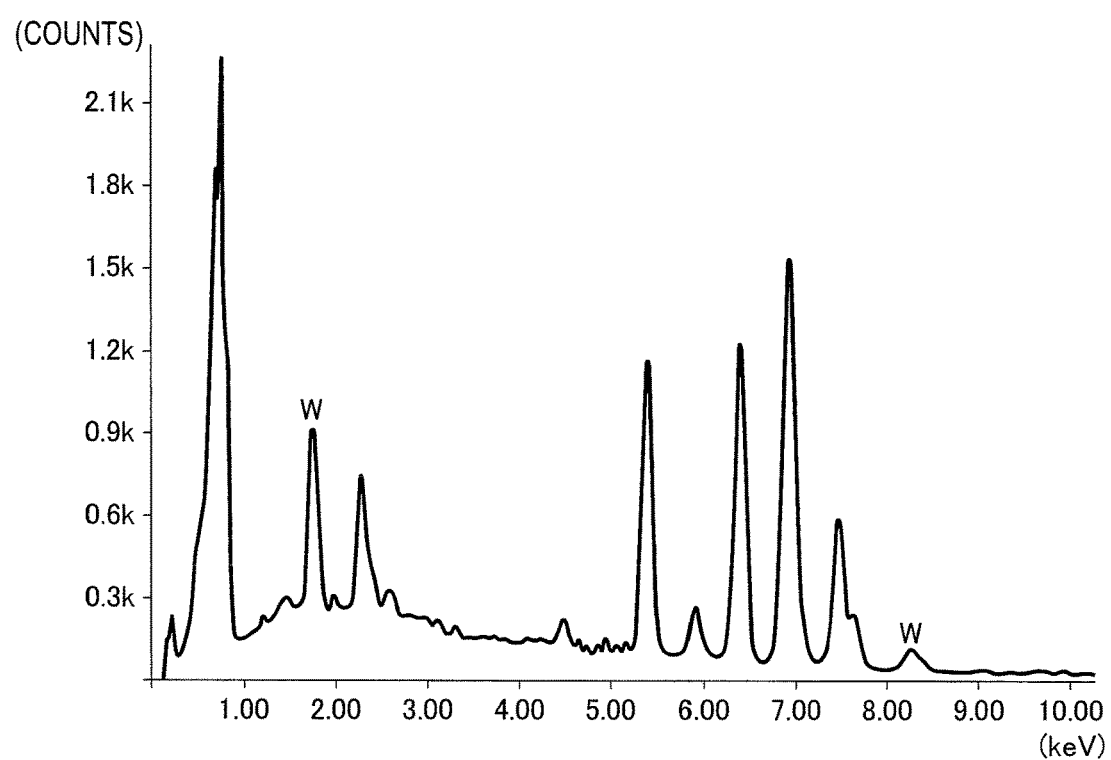
FIG. 8 shows EDX analysis results of the diaphragm of the diaphragm valve.

Further, the composition of the diaphragm 52 after the hydrogen chloride gas was supplied was analyzed using energy dispersive X-ray spectroscopy (EDX). The results are shown in FIG. 8.

From the SEM image shown in FIG. 7, it can be observed that the surface of the diaphragm 52 was corroded. Further, as shown in FIG. 8, W contained in SPRON 100 was detected.

Figure 9:
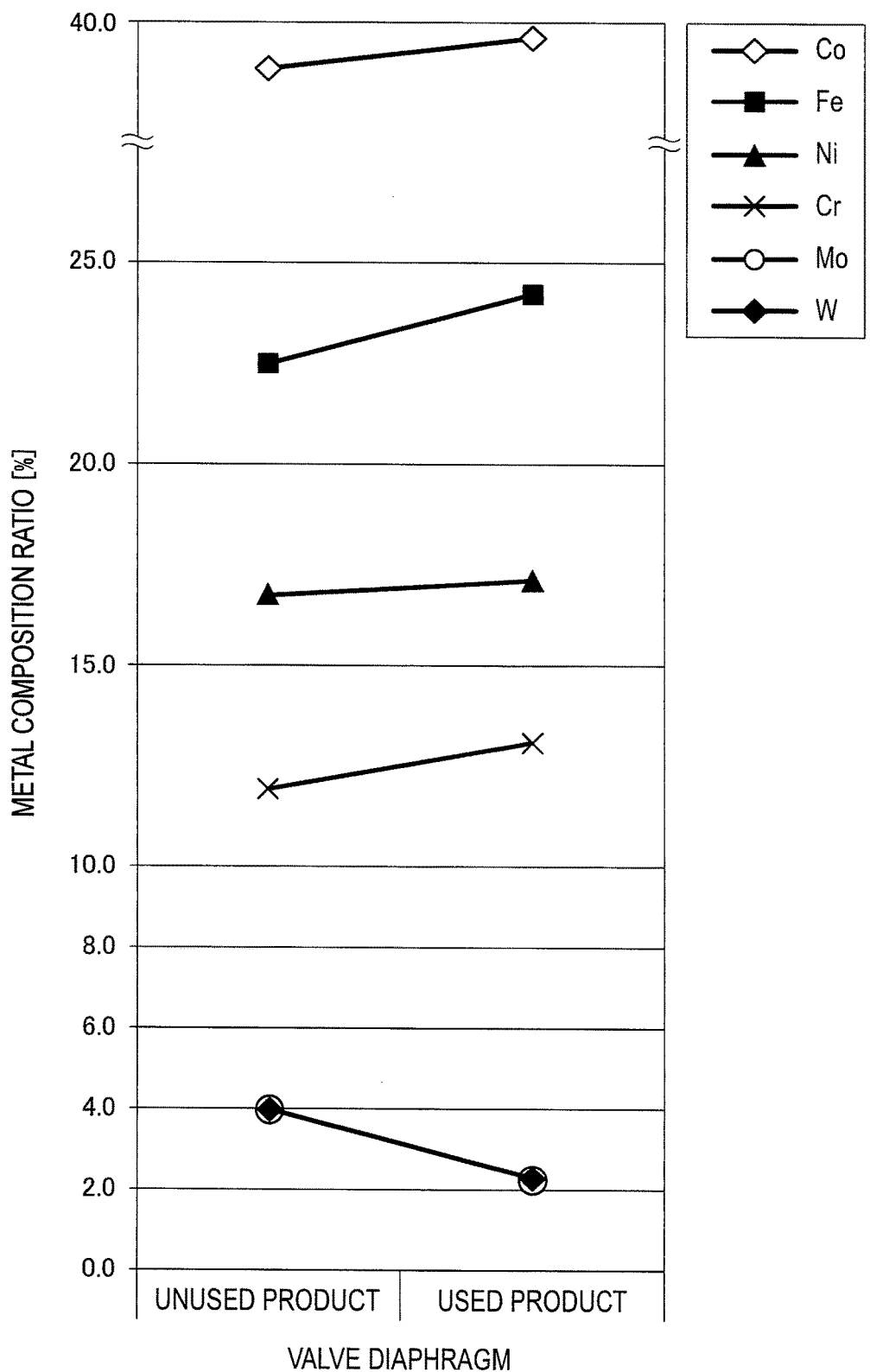
FIG. 9 is a graph showing a result of comparison of a metal composition ratio between unused and used diaphragms in the diaphragm valve.

Next, a diaphragm used for a plurality of times (referred to as a used product hereinafter) and an unused product (referred to as a new diaphragm hereinafter) were prepared. Then, the composition of these diaphragms was analyzed to compare the ratios of the metal components of these diaphragms. The results are shown in FIG. 9. It should be noted that six metal elements (Co, Fe, Ni, Cr, Mo, W) of the metal components of the diaphragm 52 were compared in FIG. 9.

As shown in FIG. 9, it was observed that the composition ratios of Mo and W were lowered in the used product as compared with the unused product. From the results, it is speculated that the above elements of which composition ratios were reduced were introduced into the chamber 2 due to corrosion.

Study on Pressure Regulator Valve

Next, the following evaluation test was conducted for the pressure regulator valve 40 installed in the hydrogen-chloride-gas supply apparatus. As a material for the diaphragm 42 of the pressure regulator valve 40, HASTELLOY C22 (one of Ni—Cr—Mo alloys, which is excellent in corrosion resistance, manufactured by Haynes International KK: HASTELLOY is a registered trademark) was used. As shown in the above Table 1, HASTELLOY C22 is an alloy containing W.

Hydrogen chloride gas was supplied from the hydrogen-chloride-gas supply apparatus 3 into the chamber 2. Subsequently, after the hydrogen chloride gas was supplied, an image of a surface of the diaphragm 42 of the pressure regulator valve 40 was taken by an SEM. The results are shown in FIG. 10.

Figure 11:
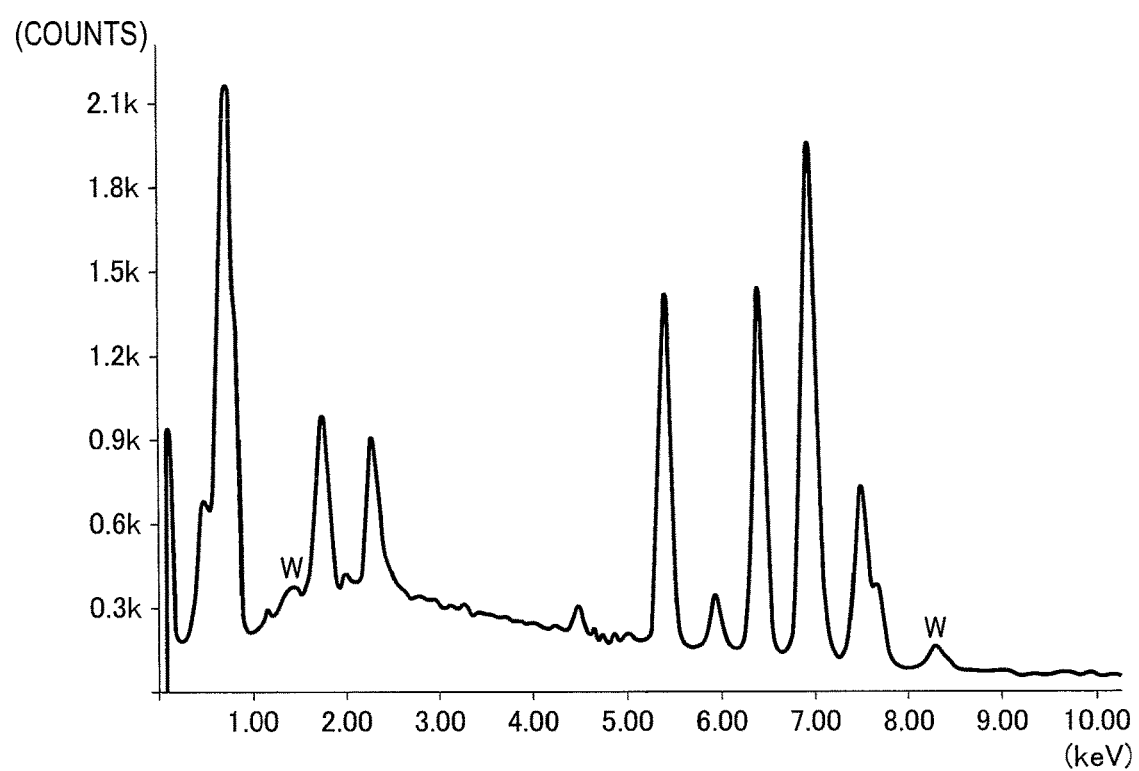
FIG. 11 shows EDX analysis results of the diaphragm of the pressure regulator valve.

Further, the composition of the diaphragm 42 of the pressure regulator valve 40 after the hydrogen chloride gas was supplied was analyzed using EDX. The results are shown in FIG. 11.

Figure 10:
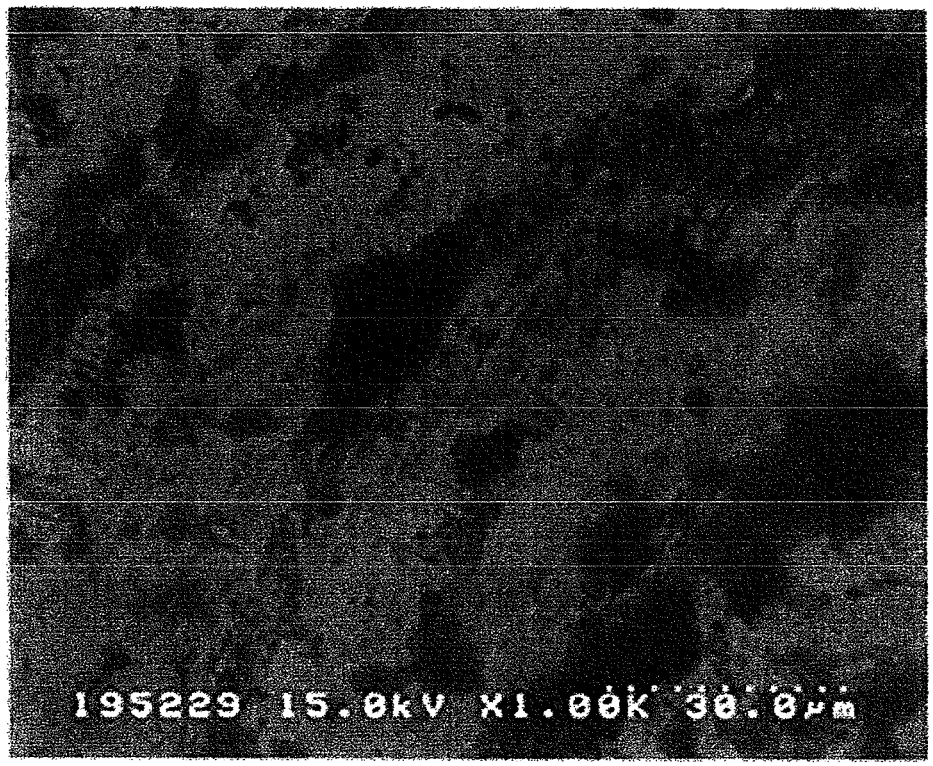
FIG. 10 is an SEM image of a diaphragm of a pressure regulator valve.

From the SEM image shown in FIG. 10, it can be observed that the surface of the diaphragm 42 was corroded. Further, as shown in FIG. 11, W contained in HASTELLOY C22 was detected.

Figure 12:
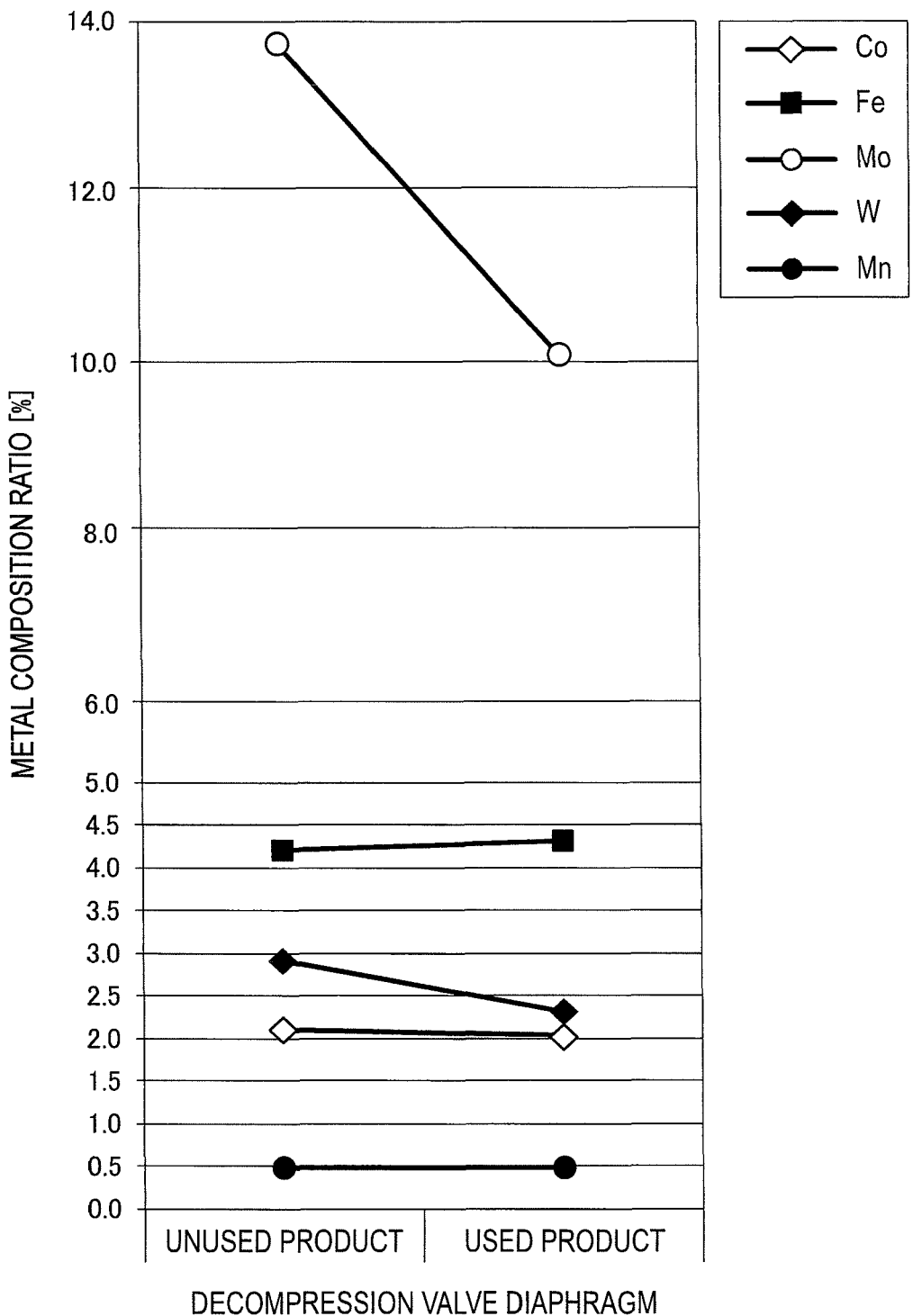
FIG. 12 is a graph showing a result of comparison of a metal composition ratio between unused and used diaphragms in the pressure regulator valve.

Subsequently, a used product and an unused product for the diaphragm 42 of the pressure regulator valve 40 were prepared and the composition of these diaphragms was analyzed to compare the metal composition of the diaphragms. The results are shown in FIG. 12. It should be noted that five metal elements (Co, Fe, Mo, W, Mn) of the metal components of the diaphragm of the pressure regulator valve 40 were compared in FIG. 12.

As shown in FIG. 12, it was observed that the composition ratio of Mo and W was lowered in the used product as compared with the unused product. From the results, it is speculated that the above elements of which composition ratio was reduced were introduced into the chamber 2 due to corrosion.

Further, the material of a part of the components (e.g. the seat 413 defining the channel in the pressure regulator valve 40) of the pressure regulator valve 40 is the same as the material of the diaphragm 42. Accordingly, with regard to the used product, it is speculated that the contamination metal is also introduced into the chamber 2 due to the corrosion of these components.

Study on Types of Contamination Metal

Next, a sample epitaxial silicon wafer with no white defect being generated and a sample epitaxial silicon wafer with the white defects being generated were prepared and the concentrations of W and Mo on the surface of the epitaxial layer were measured using an ICP-MS.

Figure 13:
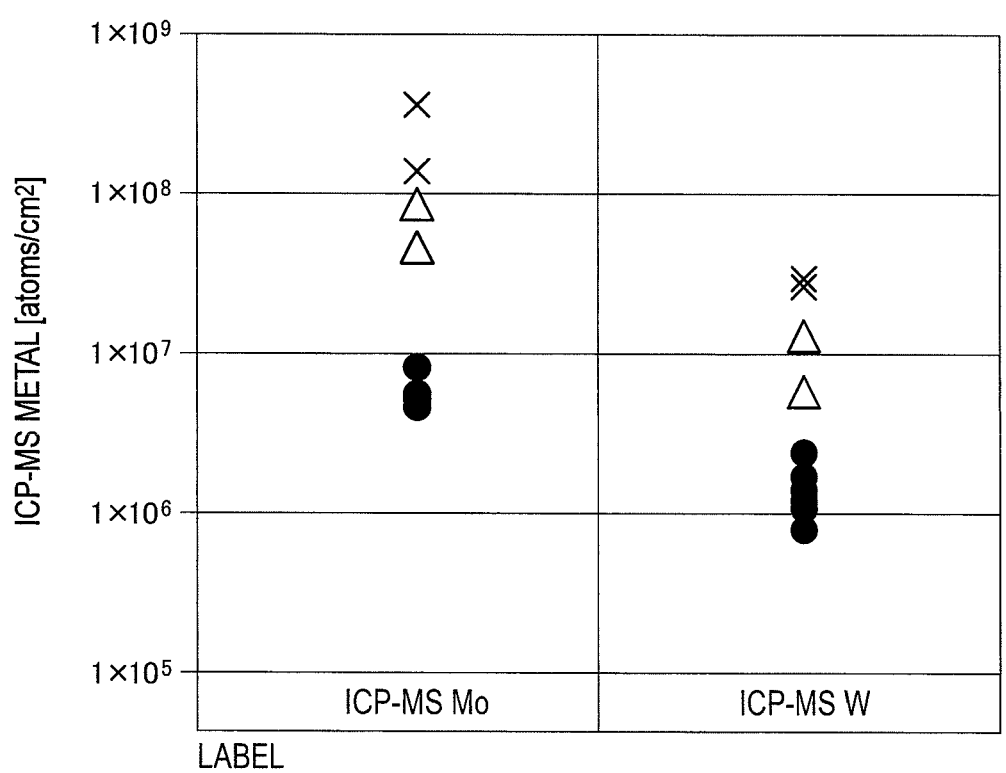
FIG. 13 shows a relationship between presence/absence of a white defect and a concentration of W or Mo.

W concentration is shown in the right side of FIG. 13 and Mo concentration is shown on the left side of FIG. 13. In FIG. 13, a circle mark represents the sample with no white defect being generated, a triangular mark represents a sample that was determined to be usable for image pickup devices though with slight white defects being generated, and a cross mark represents a sample that was determined to be unable to be used for image pickup devices with white defects being generated thereon.

As shown in FIG. 13, the comparison between the W concentration and Mo concentration reveals that the white defects were not generated at Mo concentration around $1 \times 10^7$ atoms/cm$^2$, whereas the white defects were not generated at W concentration of $5 \times 10^6$ atoms/cm$^2$ or less. It is speculated from the results that W contamination contributes more to the generation of white defects than Mo contamination.

Based on the results of the studies on each of the components and types of the contamination metal, it is speculated that, when the chamber is cleaned, the diaphragm 52 of the diaphragm valve 50 and/or the diaphragm 42 of the pressure regulator valve 40 are corroded and W is introduced from the hydrogen-chloride-gas supply apparatus 3 into the chamber 2, whereby the epitaxial silicon wafer is contaminated with W.

The invention has been reached based on the above findings.

According to the production method of the epitaxial silicon wafer of the exemplary embodiment, a W-free anti-corrosion alloy material is used for the diaphragms 42, 52. An example of the W-free anticorrosion alloy material is a W-free Co—Ni—Cr—Mo alloy, specifically SPRON 510 (manufactured by Seiko Instruments Inc.: SPRON is a registered trademark). The composition of SPRON 510 is shown in the above Table 1.

Further, a W-free Ni—Cr—Mo alloy is used for the component defining the channel in the pressure regulator valve 40. An example of the W-free Ni—Cr—Mo alloy is a MAT21 (manufactured by MMC Superalloy Corporation: MAT21 is a registered trademark). The composition of MAT21 is shown in the above Table 1.

It should be noted that SPRON 510 is a material with a higher Mo composition ratio than that of SPRON 100. Normally speaking, a material with a higher Mo concentration should not be used in view of Mo contamination that is supposed to contributed to the generation of white defects. On the other hand, the above-described studies by the inventors revealed that the primary cause of the generation of white defects was the presence of W. Based on the above, the inventors have concluded that it is effective to increase the Mo concentration to enhance the corrosion resistance to restrain the corrosion per se and to select a W-free material. The advantages of the invention can be achieved by the use of SPRON 510 satisfying the above requirements. Further, since the same as the above applies to the relationship between HASTELLOY C22 and MAT21, the advantages of the invention can be achieved with the use of MAT21.

Using the vapor deposition apparatus 1 having the above hydrogen-chloride-gas supply apparatus 3, vapor deposition is applied on a silicon wafer to produce an epitaxial silicon wafer. When a maintenance work is to be done to the inside of the chamber 2, hydrogen chloride gas is supplied from the hydrogen-chloride-gas supply apparatus 3 into the chamber 2 (chamber cleaning).

Advantage(s) of Embodiment(s)

As described above, the exemplary embodiment provides the following advantages.
(1) A W-free anticorrosion alloy material is used for a diaphragm 52 of the diaphragm valve 50 and the diaphragm 42 of the pressure regulator valve 40 in the hydrogen-chloride-gas supply apparatus 3. Accordingly, even when the diaphragms 42, 52 are corroded by the highly corrosive hydrogen chloride gas supplied by the hydrogen-chloride-gas supply apparatus 3 during the chamber cleaning, W that is supposed to greatly contribute to the generation of white defects is not eluted. Accordingly, W contamination from the hydrogen-chloride-gas supply apparatus 3 to the chamber 2 can be decreased during the chamber cleaning Consequently, with the use of the above vapor deposition apparatus 1, a high quality epitaxial silicon wafer that is capable of restraining the generation of white defects can be easily produced.
(2) Since W-free Co—Ni—Cr—Mo alloy is used as the W-free anticorrosion alloy material used for the diaphragms 42, 52, W contamination derived from the diaphragms can be restrained. Further, though the diaphragm is a difficult-to-machine component depending on the materials, the above alloy is easily machined and can keep the same performance as that of the conventionally used material.
(3) Since the W-free Ni—Cr—Mo alloy is used for the component defining the channel in the pressure regulator valve 40, W contamination derived from the pressure regulator valve 40 can be restrained. Consequently, W contamination introduced from the hydrogen-chloride-gas supply apparatus 3 to the chamber 2 can be further decreased.

Other Embodiment(s)

It should be noted that the scope of the invention is not limited to the above-described exemplary embodiment(s), but can be variously modified or altered in design in a range compatible with an object of the invention. In addition, specific steps and structures in implementing the invention may be altered as long as such an alteration is compatible with an object of the invention.

EXAMPLE(S)

Next, the invention will be described below in further details with reference to Examples. It should be noted, however, that the scope of the invention is not limited by the Example(s).

Example 1

Using the vapor deposition apparatus 1 shown in FIG. 1, repeated cycles of preparing epitaxial silicon wafers and cleaning the chamber after the epitaxial treatment was applied on a predetermined number of the wafers were conducted. In conducting the above repeated cycles, experiments of changing the material of the diaphragm 52 defining a part of the decompression unit 32 and the VMB 33 of the hydrogen-chloride-gas supply apparatus 3 were conducted. Specifically, W-free SPRON 510 (Example 1) and SPRON 100 (Comparative 1) containing 4% of W were used in the experiments.

Then, the W concentration on the surface of the epitaxial layer was measured for each of the samples obtained after the above repeated cycles. The W concentration was measured as follows. Acidic solution was dropped on the surface of the epitaxial layer and the surface of the wafer was scanned to collect metal impurities on the surface of the epitaxial layer in the solution. The collected solution was subjected to a quantitative analysis using ICP-MS.

The material of the diaphragm 42 of the pressure regulator valve 40 defining a part of the decompression unit 32 of the hydrogen-chloride-gas supply apparatus 3 in Example 1 is SPRON 100 containing 4% of W. Further, the material of the component (e.g. seat 413) defining a channel in the pressure regulator valve 40 is HASTELLOY C22 containing 2.5 to 3.5% of W.

Figure 14:
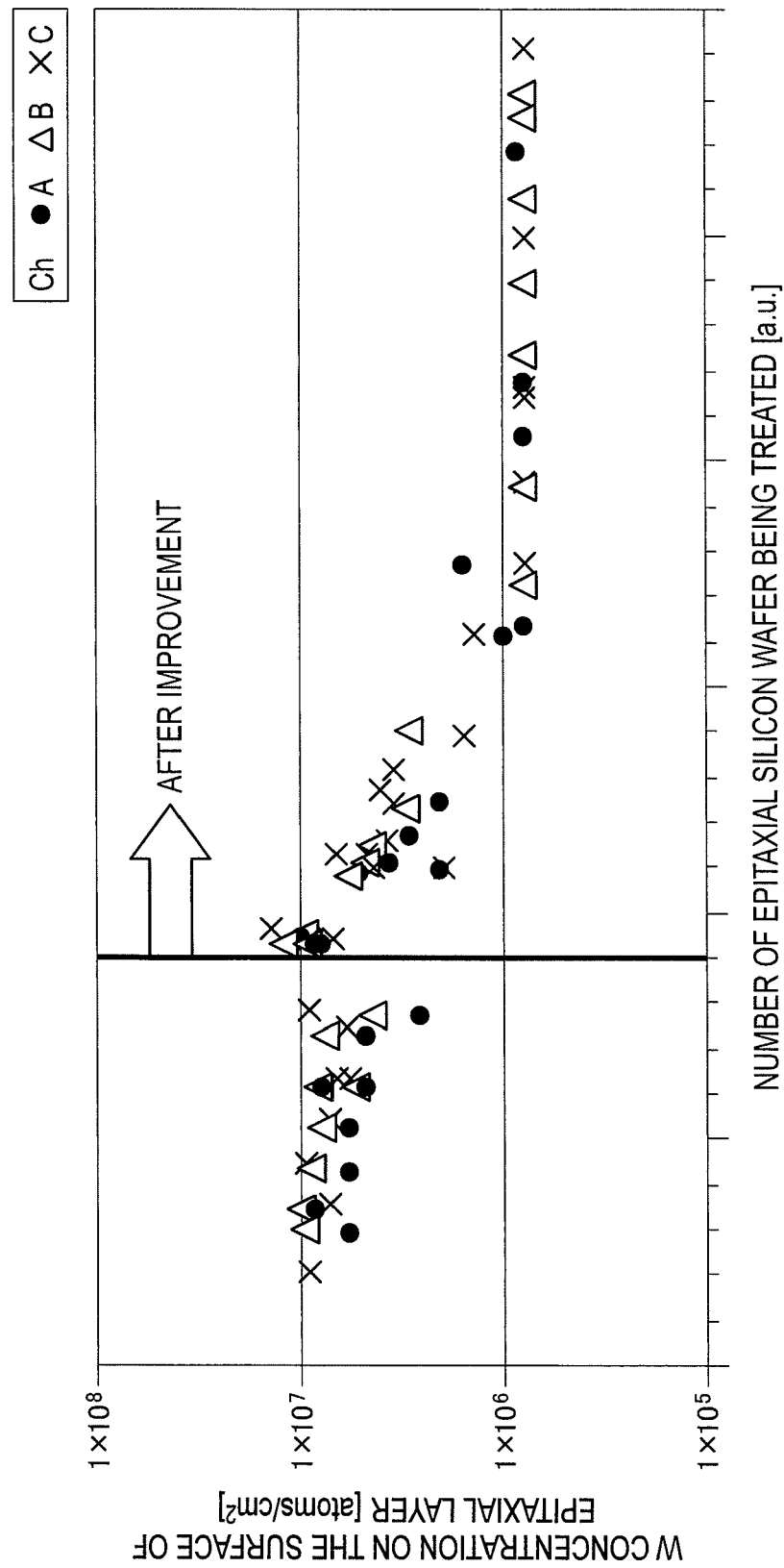
FIG. 14 shows a transition of W concentration in an epitaxial layer of samples prepared before and after an alteration of a material of the diaphragm valve in Example 1.

The results are shown in FIG. 14. Bold line in the figure represents a point at which the material of the diaphragm 52 was changed. It should be noted that legends at "Ch" in FIG. 14 indicate the chambers A, B and C each connected to the VMB 33 in which the samples were produced.

As shown in FIG. 14, the W concentration on the surface of the epitaxial layer of Comparative 1 using the diaphragm 52 made of SPRON 100 containing 4% of W was around $1 \times 10^7$ atoms/cm$^2$. In contrast, the sample of the present Example using the diaphragm 52 made of W-free SPRON 510 exhibited W concentration on the surface of the epitaxial layer at $1\times10^6$ atoms/cm$^2$ or less. According to the above results, it can be understood that, with the use of W-free material for the material of the diaphragm, a high quality epitaxial silicon wafer that is capable of restraining the generation of white defects can be easily produced.

Example 2

Except that the material of the diaphragm 42 of the pressure regulator valve 40 and the component (e.g. the seat 413) defining the channel in the pressure regulator valve 40 was changed as below, samples of epitaxial silicon wafers were produced in the same manner as in Example 1. Then, the W concentration on the surface of the epitaxial layer was measured for the obtained samples.

Comparative 2: The material of the diaphragm 42 of the pressure regulator valve 40: SPRON 100 containing 4% of W, the material of the component (e.g. seat 413) defining the channel in the pressure regulator valve 40: HASTELLOY C22 containing 2.5 to 3.5% of W.

Example 2: The material of the diaphragm 42 of the pressure regulator valve 40: W-free SPRON 510, the material of the component (e.g. seat 413) defining the channel in the pressure regulator valve 40: W-free MAT21.

The material of the diaphragm valve 52 of the diaphragm valve 50 defining a part of the decompression unit 32 and VMB 33 in the present Example 2 was SPRON 100 containing 4% of W.

Figure 15:
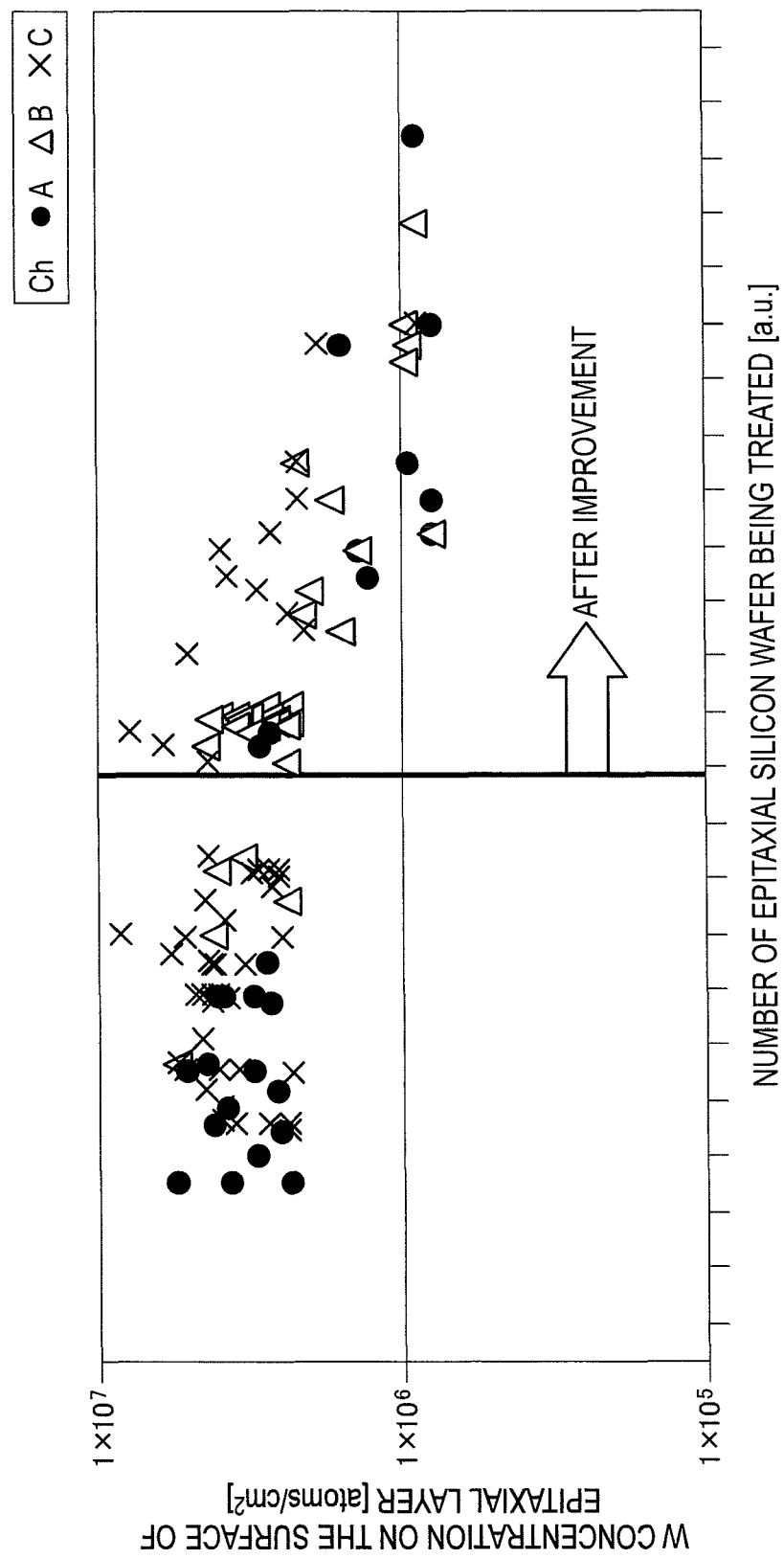
FIG. 15 shows a transition of W concentration in an epitaxial layer of samples prepared before and after an alteration of a material of the pressure regulator valve in Example 2.

The results are shown in FIG. 15. Bold line in the figure represents a point at which the material was changed. It should be noted that legends at "Ch" in FIG. 15 indicate the chambers A, B and C each connected to the VMB 33 in which the samples were produced.

As shown in FIG. 15, the W concentration on the surface of the epitaxial layer was around $5\times10^6$ atoms/cm$^2$. In contrast, though the W concentration of the sample of the present Example 2 was fluctuated immediately after the material change in the present Example 2, it was observed that the W concentration on the surface of the epitaxial layer of the sample was lowered to $1\times10^6$ atoms/cm$^2$ or less after a predetermined time.

What is claimed is:

1. A method for producing an epitaxial silicon wafer comprising:
    applying a vapor deposition on a silicon wafer to obtain the epitaxial silicon wafer, wherein
    a vapor deposition apparatus, in which the vapor deposition is conducted, at least comprises a chamber, and a hydrogen-chloride-gas supply apparatus that is in communication and connected with an inside of the chamber to supply hydrogen chloride gas into the chamber,
    a valve that comprises a diaphragm configured to regulate a flow of the hydrogen chloride gas from an inlet channel to an outlet channel is disposed in the hydrogen-chloride-gas supply apparatus,
    a W-free anticorrosion alloy material is used for the diaphragm, and
    when a maintenance work is to be done to the inside of the chamber, the hydrogen chloride gas is supplied from the hydrogen-chloride-gas supply apparatus into the chamber.

2. The method for producing an epitaxial silicon wafer according to claim 1, wherein
    the W-free anticorrosion alloy material is a W-free Co—Ni—Cr—Mo alloy.

3. The method for producing an epitaxial silicon wafer according to claim 2, wherein
    the valve comprising the diaphragm is a pressure regulator valve configured to regulate a pressure of the hydrogen chloride gas flowing therein, and
    a W-free Ni—Cr—Mo alloy is used for a component defining a channel in the pressure regulator valve.

* * * * *